United States Patent
Zachan et al.

(10) Patent No.: US 6,707,342 B1
(45) Date of Patent: Mar. 16, 2004

(54) MULTIPLE-VCO TUNING

(75) Inventors: Jeffrey M. Zachan, Corona Del Mar, CA (US); Jackie Cheng, Irvine, CA (US); Alyosha C. Molnar, Berkeley, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 11 days.

(21) Appl. No.: 10/114,182

(22) Filed: Apr. 2, 2002

(51) Int. Cl.[7] .............................. H03L 7/099; H03L 7/10
(52) U.S. Cl. .............................. 331/2; 331/14; 331/16; 331/17; 331/DIG. 2; 375/376; 455/260
(58) Field of Search .............................. 331/1 A, 2, 14, 331/16, 17, 18, 25, 44, 46, 49, DIG. 2; 327/156–159; 375/376; 455/260

(56) References Cited

U.S. PATENT DOCUMENTS 6,512,801 B1 * 1/2003 Ninomiya .................... 375/316

* cited by examiner

*Primary Examiner*—David C. Mis
(74) *Attorney, Agent, or Firm*—Mintz, Levin, Cohn, Ferris, Glovsky and Popeo, P.C.

(57) ABSTRACT

A tuning circuit for use in tuning multiple voltage-controlled oscillators (VCOs) of a phase-locked loop (PLL) is provided. A search algorithm is used to determine which VCO to use for a given frequency to be synthesized by the PLL. The tuning circuit provides a binary representation, associated with the frequency to synthesize, to the PLL. The PLL responds to this representation by attempting to synthesize the associated frequency. New binary representations are provided until an indication of a threshold frequency between multiple VCOs is determined. A record of the threshold frequency is stored. The binary representation of a frequency to be synthesized and the stored record of the threshold frequency are used to provide an indication of which VCO of the PLL to use to synthesize the desired frequency.

46 Claims, 6 Drawing Sheets

MULTIPLE-VCO TUNING

BACKGROUND OF THE INVENTION

1. Technical Field

The invention relates to the use of voltage-controlled oscillators and more particularly to systems that may employ multiple voltage-controlled oscillators.

2. Background of the Invention

Generally, a voltage-controlled oscillator (VCO) is an essential circuit, such as in phase-locked loop (PLL) systems, and is typically used to provide an output signal whose frequency is tunable with a control voltage (tuning voltage) typically referred to as $V_{tune}$. The tuning voltage typically varies from a minimum of about a fixed voltage $V_1$ (e.g., 0.3 V) to a maximum voltage, typically referred to as $V_{CC}$, minus a fixed voltage $V_2$ (e.g. 2.7 V–0.5 V=2.2 V). Fixed voltages $V_1$ and $V_2$ are dependent on the type of charge pump that the PLL uses.

A VCO has a limited amount of tuning range. The tuning range depends, e.g., on the amount of tuning voltage $V_{tune}$ that is available, and on a varactor used by the VCO. The ratio of the frequency range and the tuning voltage is referred to as VCO sensitivity ($K_v$). Low-sensitivity VCOs are often desirable to provide good circuit characteristics to reduce or minimize noise.

SUMMARY

A number of technical advances are achieved in the art to provide a PLL capable of synthesizing frequencies over a wide frequency range. This is achieved by employing multiple VCOs, with overlapping frequency ranges, in conjunction with a tuning circuit. The tuning circuit may be broadly conceptualized as a system that may determine, and/or select, which of multiple VCOs of the PLL to use for a desired output oscillation frequency. Using such a system, a PLL can seamlessly lock to a wide range of frequencies using the multiple VCOs. The tuning circuit may determine and select which VCO to use, and tune the PLL, without using any devices located, or signals from, off chip relative to the PLL. The tuning circuit may also help reduce, and even minimize, the number of VCOs used to cover a particular frequency range.

For example, a tuning circuit in the PLL may receive signals indicative of various frequencies and may determine which VCO to use for each signal according to the indicated frequency. An implementation of the system architecture may include a comparator, a loop filter, a binary search algorithm circuit (BSAC), a PLL mapping encoder, and a VCO selector. In a calibration mode, a VCO is selected and the comparator compares an output voltage of the loop filter with an on-chip reference voltage. The BSAC uses an output of the comparator to determine the range of the selected VCO. In particular, the BSAC iteratively produces indications of test words to apply to the selected VCO. The PLL mapping encoder scales the BSAC indications and provides N-bit multipliers to the PLL containing multiple VCOs. The PLL attempts to lock to the desired test frequencies using the VCO selected by the VCO selector. The BSAC responds to whether the PLL locks to the test frequencies by adjusting, as appropriate, the indication from the BSAC, and thus the frequency to which the PLL attempts to lock. A record indicative of the VCO to select depending upon an indicated frequency is stored in the VCO selector. In a normal operation mode, in response to an incoming signal being received, the VCO selector uses an indication of a frequency from the incoming signal and the stored record to select an appropriate VCO to use to lock to the frequency indicated by the incoming signal.

Other systems, methods, features and advantages of the invention will be apparent to one with skill in the art or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principals of the invention.

Reference will now be made in detail to the description of the invention as illustrated in the figures. While the invention will be described in connection with these figures, there is no intent to limit it to the embodiment or embodiments disclosed in these figures. On the contrary, the intent is to cover all alternatives, modifications, and equivalents included within the spirit and scope of the invention as defined by the appended claims.

DETAILED DESCRIPTION OF PREFERRED EMBODIMENTS

Figure 1:
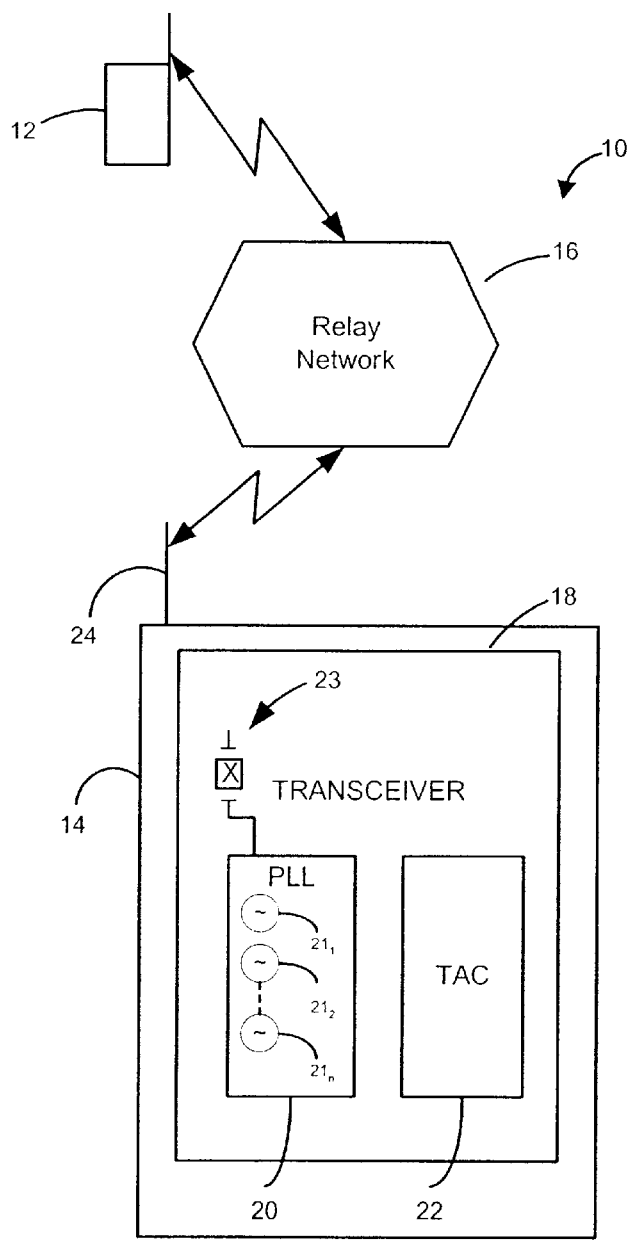
FIG. 1 is a schematic diagram of a telecommunications system.

Referring to FIG. 1, a wireless communication system 10 includes two communication devices 12 and 14 and a relay network 16. The device 14, e.g., a cellular phone, includes a transceiver 18 that further includes a PLL 20 and a tuning algorithm circuit (TAC) 22. In at least one embodiment, the transceiver 18 can be configured as an integrated circuit, with the transceiver's components, including the PLL 20 and the TAC 22, sharing a single common semiconducting substrate. The TAC 22 does not have to be on the same substrate as the transceiver 18. Moreover, the TAC 22 does not need to be on the same substrate as the PLL, although this approach is generally more desirable. In at least one embodiment, the PLL 20 contains multiple VCOs $21_1$–$21_n$ (three shown) and is configured to receive a reference frequency fREF from a crystal oscillator 23. The PLL 20 is configured to lock to the reference frequency fREF, after being scaled according to an indication in an incoming signal, using one of the multiple VCOs 21 and the TAC 22. The TAC 22 is configured to select which one of multiple VCOs contained in the PLL 20 to use to synthesize a particular frequency (the scaled reference, or carrier, frequency).

Figure 2:
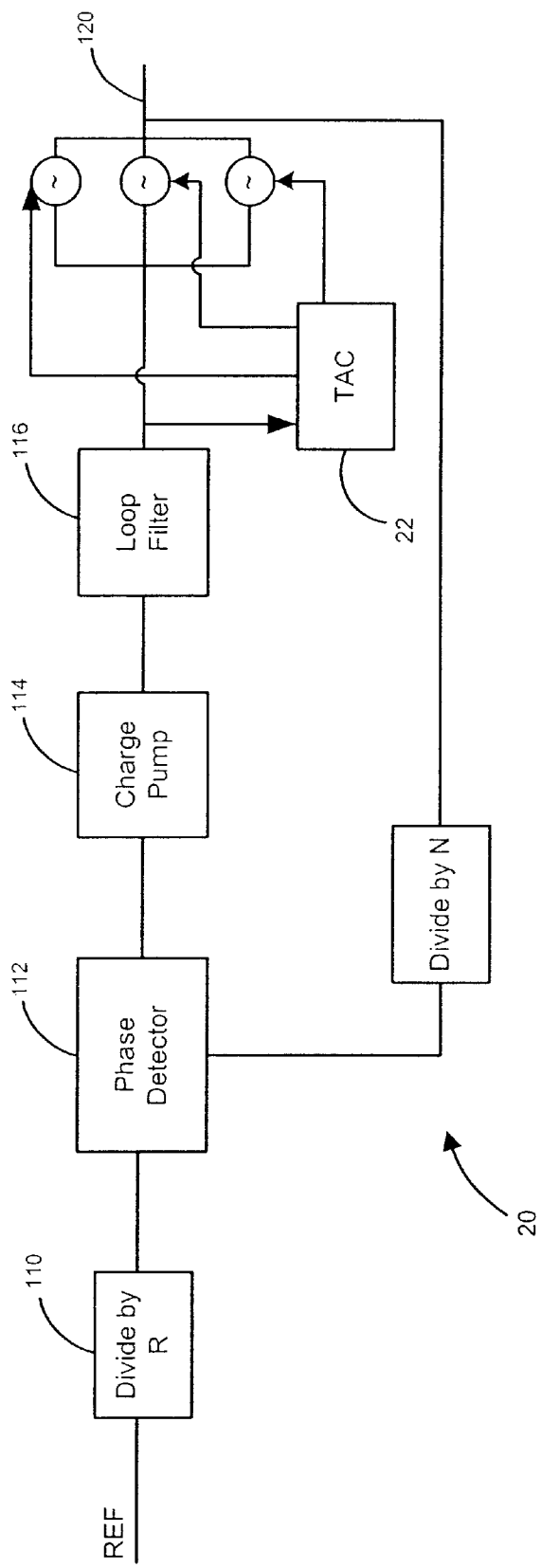
FIG. 2 is a block diagram of portions of a transceiver shown in FIG. 1, including multiple VCOs and a tuning circuit for the multiple VCOs.

Referring to the embodiment of FIG. 2, the PLL 20 includes a divide-by-R circuit 110, a phase detector 112, a charge pump 114, a loop filter 116, the multiple VCOs $21_1$–$21_n$, the TAC 22, and a divide-by-N circuit 118. The PLL 20 is configured to receive the reference frequency $f_{REF}$ into the circuit 110, that scales the reference frequency $f_{REF}$ accordingly to provide a scaled signal $f_{SREF}$. The PLL 20 is further configured to provide an output 120 from one of the VCOs 21 having approximately the same frequency as the scaled signal $f_{SREF}$. In a preferred embodiment, the circuits 110 and 118, the phase detector 112, the charge pump 114, the VCOs 21, and the TAC 22 are disposed on a common semiconducting substrate chip. The loop filter 116 is typically disposed off of this common substrate (i.e., off chip).

Figure 3:
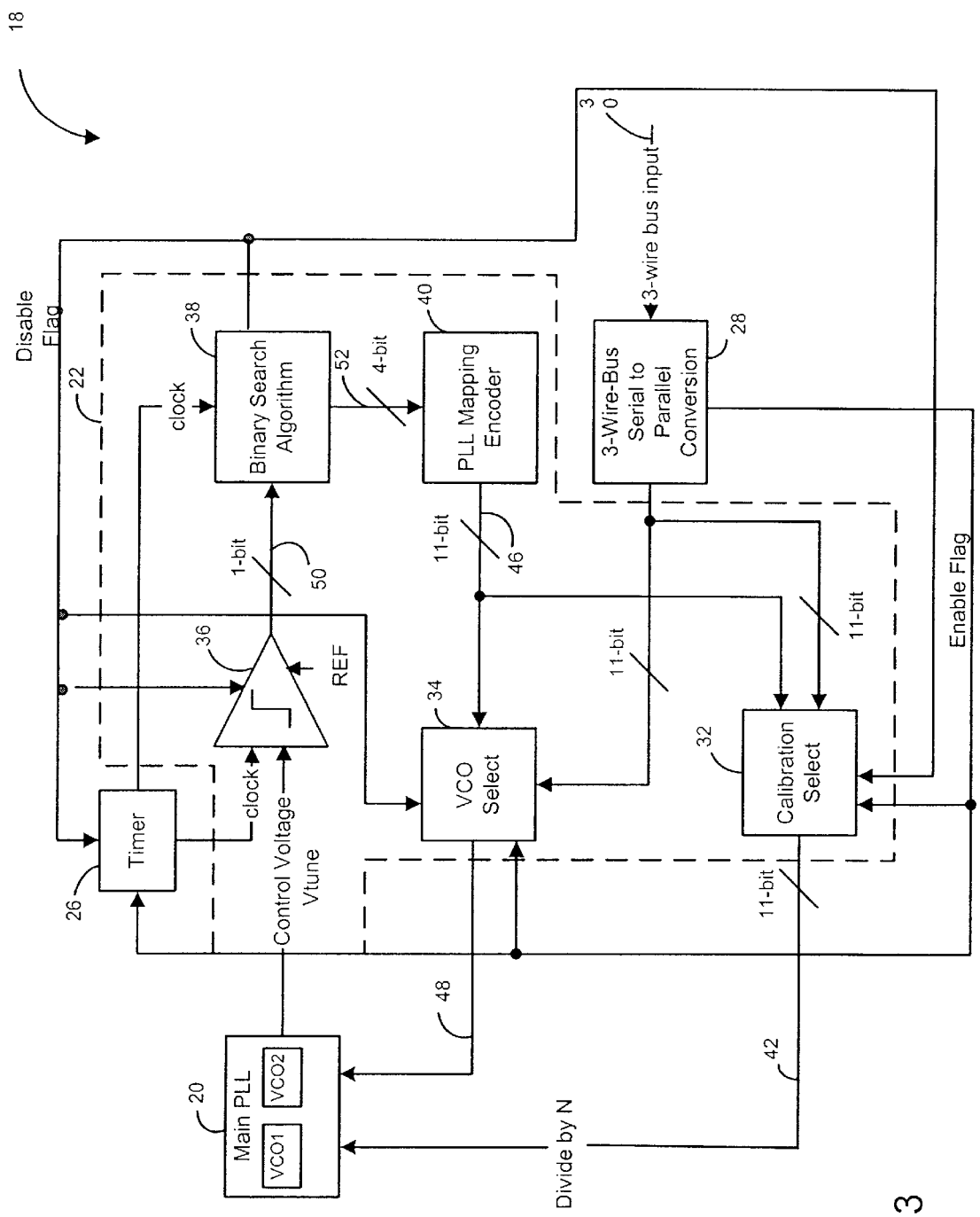
FIG. 3 is a block diagram of portions of the transceiver shown in FIG. 1.

Referring to FIG. 3, the transceiver 18 includes the PLL 20, the TAC 22, a timer 26, and a 3-wire bus serial-to-parallel conversion circuit (3-wire circuit) 28. The PLL 20 is configured to lock to the scaled reference signal $f_{SREF}$ (FIG. 2) using one of multiple VCOs, such as VCOs $VCO_1$ and $VCO_2$. Information regarding which VCO to use is determined and provided by the TAC 22. Various functions of the TAC 22 are regulated in accordance with clock signals provided by the timer 26. In at least one embodiment, information, including an indication of the frequency that the PLL 20 is to lock to (e.g., a carrier frequency), may be provided to the TAC 22 by the 3-wire circuit 28 or other information circuitry. Although various lines in FIG. 3 are labeled with data quantities of interest for the discussions below, other amounts of data can be transmitted on these lines.

In the embodiment of FIG. 3, the 3-wire circuit 28 is configured to receive the incoming signal on a 3-wire bus input 30 and to provide information regarding the frequency to lock to and a calibration enable signal to the TAC 22. The 3 wires in the bus 30 include a data line, a clock line, and an enable line. The transceiver 18 is configured such that at power-up of the transceiver 18, the enable signal on the enable line indicates that calibration of the TAC 22 should be enabled. For example, at power-up the enable signal can be set to a high level, or a binary one. The 3-wire circuit 28 is connected to the TAC 22 to provide the enable signal to various components of the TAC 22, and is also connected to provide the enable signal to the timer 26. In at least one embodiment, the 3-wire circuit 28 may be further configured and connected to convert the data received on the data line of the 3-wire bus 30 from a serial format into a parallel format, and to provide the parallel data to the TAC 22.

In at least one embodiment, the TAC 22 may include a calibration select circuit (calibration select) 32, a VCO select circuit 34, a comparator 36, a binary search algorithm circuit (BSAC) 38, and a PLL mapping encoder (PLLME) 40. These components are configured to determine a frequency range of $VCO_1$ (that can be extended to N−1 VCO's in a system with N VCO's) of the PLL 20 during a calibration mode and to select either $VCO_1$ or $VCO_2$ in the present example in accordance with an frequency (e.g., of a carrier frequency based, e.g., upon a selected transmission channel) during an operation/normal mode. For example, here the TAC 22 is configured to determine cross-over points of frequency ranges between $VCO_1$ and $VCO_2$ by finding the maximum usable frequency (within a resolution of the TAC 22) to which $VCO_1$ can tune.

The calibration select circuit 32 is coupled to the PLLME 40, the 3-wire circuit 28, and the BSAC 38 and is configured to provide an output indicative of a frequency of a signal to which the PLL 20 should try to lock. Indications of this frequency may come from either the PLLME 40, the 3-wire circuit 28, or other information circuitry. Which indication (i.e., from the PLLME 40 or the 3-wire circuit 28) to use depends on whether calibration is enabled or disabled. The calibration select 32 is a digital data switch that is configured such that if the calibration select 32 receives the enable flag from the 3-wire circuit 28, then the calibration select 32 conveys the indication received from the PLLME 40 as the output signal 42. If the calibration select 32 is disabled by receiving a disable flag from the BSAC 38, then the calibration select 32 forwards the frequency indication of the 11-bit data received from the 3-wire circuit 28 as the output signal 42. In either case, the output signal 42 is indicative of an output frequency divided by a reference frequency. The output signal 42 is provided to the PLL 20, and in particular to a fractional-N synthesizer that is configured to use the output signal 42 to produce a signal of the output frequency to which the PLL 20 is to lock using the selected VCO.

The VCO select 34 coupled to the PLLME 40, the 3-wire circuit 28, and the BSAC 38 and is configured to provide a VCO select signal 48. A connection from the VCO select 34 to the 3-wire circuit 28 provides the enable flag to the VCO select 34. The VCO select 34 is configured to, in response to receiving the enable flag (calibration mode), provide the VCO select signal 48 to instruct the PLL 20 to use $VCO_1$. The VCO select 34 is further configured to, in response to receiving the disable flag from the BSAC 38 (normal operation mode), determine the VCO select signal 48 in response to analysis of signals received from the PLLME 40 and the 3-wire circuit 28. During normal mode, the VCO select 34 compares the indications of frequencies from the PLLME 40 and the 3-wire circuit 28.

The VCO select 34 may be a digital comparator configured to indicate, via the VCO select signal 48, which VCO to use. The VCO select signal 48 instructs the PLL 20 to use $VCO_1$ if the frequency indicated by a signal 44 from the 3-wire circuit 28 is less than or equal to the frequency indicated by a signal 46 from the PLLME 40. The VCO select signal 36 instructs the PLL 20 to use $VCO_2$ if the frequency indicated by the signal 44 from the 3-wire circuit 28 is greater than the frequency indicated by the signal 46 from the PLLME 40. Alternatively, the VCO select signal 36 could instruct the PLL 20 to use $VCO_2$ if the signals 44 and 46 are equal, provided that the overlap in frequency ranges of $VCO_1$ and $VCO_2$ is sufficient.

The PLL 20 generally includes multiple VCOs, here $VCO_1$ and $VCO_2$. The VCOs are configured to provide output signals having different ranges of frequencies in response to the same range of input tuning voltage $V_{tune}$. The different frequency ranges of $VCO_1$ and $VCO_2$ preferably overlap such that the combination of $VCO_1$ and $VCO_2$ provides a continuous frequency range that is broader than either of their individual frequency ranges. The overlapping range of frequencies preferably covers process, temperature, and supply variations, and component mismatch (e.g., inductor, varactor). The frequency ranges of the VCOs are subject to semiconductor process variation and the total tuning range of the multiple VCOs preferably covers the process variation effects by design.

The PLL 20 is coupled to the calibration select 32, the VCO select 34, and the comparator 36 of the TAC 22. The PLL 20, and in particular a fractional-N synthesizer (or, alternatively, an integer-N synthesizer) of the PLL 20, converts the calibration select output signal 42 into a signal of desired frequency. The conversion is performed according to an equation such as $f_{out} = N * f_{REF}$. The PLL 20 is further configured to provide the converted signal of the PLL 20 to either $VCO_1$ or $VCO_2$ in accordance with the VCO select signal 48 received from the VCO select 34. The PLL 20 is further configured to output the tuning voltage $V_{tune}$ to the comparator 36.

The comparator 36 is coupled to receive signals from the PLL 20 ($V_{tune}$), the timer 26, and the BSAC 38, to receive a reference voltage REF, and to compare the tuning voltage $V_{tune}$ and the reference voltage REF. The comparator 36 is configured to, from power-up of the transceiver 18 until receipt of the disable flag from the BSAC 38, compare the tuning voltage $V_{tune}$ and the reference voltage REF in response to each clock pulse received from the timer 26. In response to each clock pulse, if the tuning voltage $V_{tune}$ is below the upper threshold of the tuning voltage $V_{tune}$ (e.g., 2.2 V), indicating that the PLL 20 locked, then the comparator 36 outputs a binary 1. If the comparison indicates that the tuning voltage $V_{tune}$ is greater than the upper threshold of the tuning voltage $V_{tune}$, indicating that the frequency is too high for the PLL 20 to lock to, given the selected VCO, then the comparator 36 will output a binary 0 to the BSAC 38.

The timer 26 is coupled to receive the enable flag from the 3-wire circuit 28 and to provide clock pulse each clock cycle to the comparator 36 and the BSAC 38 in response to receiving the enable flag. The timer 26 is configured to have a cycle that is long enough for the PLL 20 to lock, if it can, to the frequency of a signal provided by the fractional-N synthesizer of the PLL 20 in response to the calibration select output signal 42. Each cycle, the timer 26 is configured to provide a clock pulse to the comparator 36 and to the BSAC 38. The timer 26 is further coupled to receive the disable flag from the BSAC 38 and to discontinue providing the clock pulses to the comparator 36 and the BSAC 38 in response to receiving the disable flag.

The BSAC 38 is coupled to receive a clock signal from the timer 26, to receive the comparator output signal 50 from the comparator 36, and to provide a BSAC output signal 52 to the PLLME 40. The BSAC 38 is configured to provide as the output signal 52 an indication of a frequency of the signal to be provided to the selected VCO of the PLL 20. The BSAC 28 is configured to determine, each clock pulse received from the timer 26, whether the selected VCO of the PLL 20 is locked as indicated by the comparator output signal 50. The output signal 52 provides an initial indication of frequency, and the BSAC 38 varies the BSAC output signal 52 depending upon whether the PLL 20 with the selected VCO is locked as indicated by the comparator output signal 50.

Figure 4:
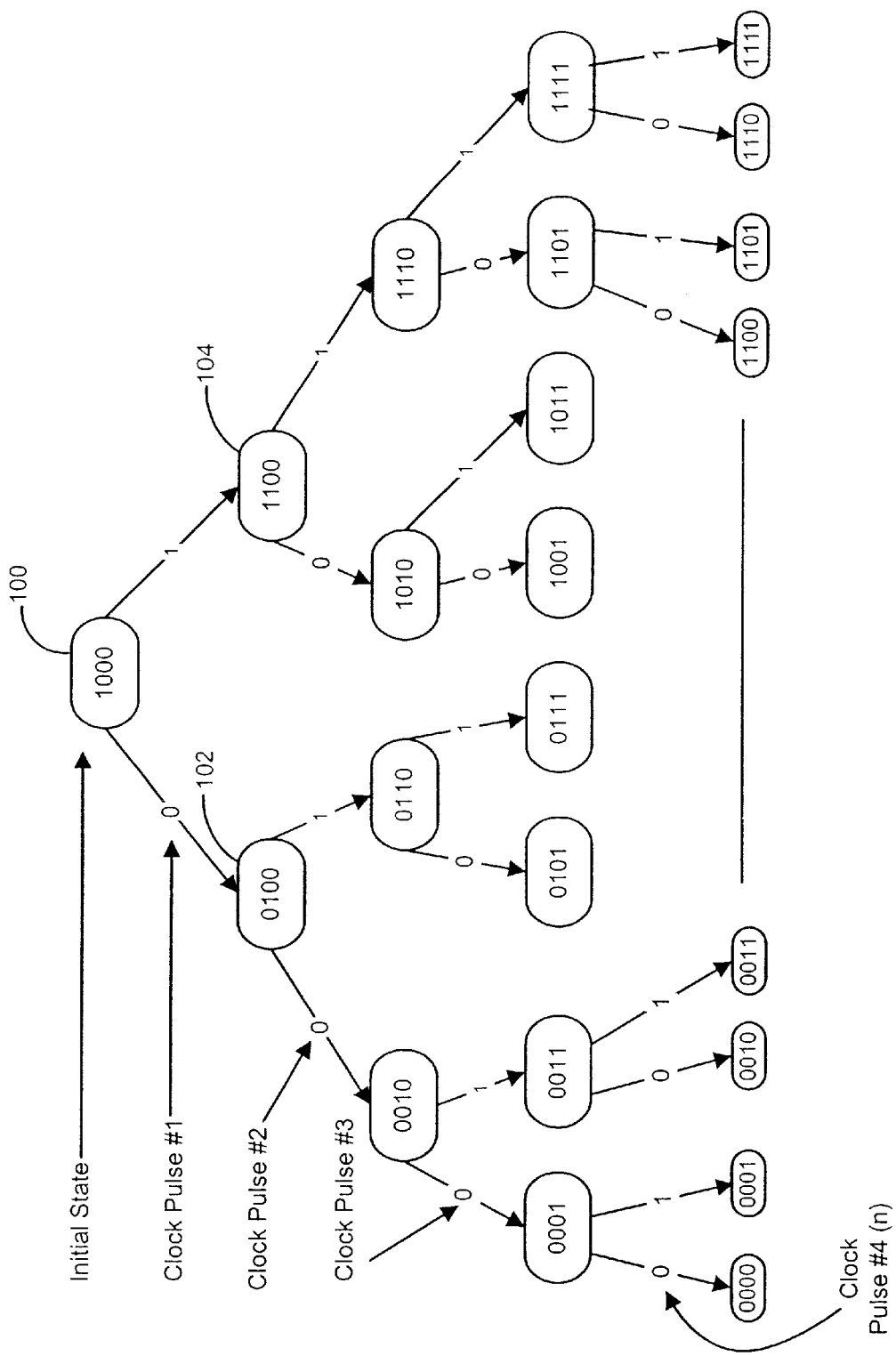
FIG. 4 is a block diagram of a decision tree implemented by a binary search algorithm circuit shown in FIG. 3.

Referring also to FIG. 4, the BSAC 38 initially outputs the 4-bit output signal 52 with a value of 1000 in response to the enable flag. In response to each clock pulse, if there is a next-most-significant bit relative to a current bit of interest, then the BSAC 38 alters the output signal 52 by toggling the next-most-significant bit. Also each clock pulse, the BSAC 38 either leaves the current bit of interest the same or toggles it depending on the comparator output signal 50. Initially, the most-significant bit of the n-bit signal 52 is the current bit of interest. Each clock pulse, the next-most-significant bit, if any, becomes the current bit of interest. If the comparator output signal 50 indicates that the PLL 20 did not lock (e.g., a binary 0), then the BSAC 38 toggles the current bit of interest (e.g., to 0) and writes the toggled value to memory. If the comparator output signal 50 indicates that the PLL 20 did lock (e.g., a binary 1), then the BSAC 38 leaves the current bit of interest at its current value (e.g., 1) and writes the unchanged value to memory. The value of 1000 is merely exemplary and not limiting. This may help reduce an average time to determine a final value of the signal 52. The initial BSAC output signal 52 is selected to indicate a frequency approximately in the middle of a frequency range that the BSAC 38 can indicate. In response to each clock pulse, a new 4-bit word indicates a frequency approximately in the middle of a subset of frequencies, the subset depending on whether the PLL 20 locked to the previous frequency indicated. The initial frequency should not be too low for the PLL 20 to lock to the indicated frequency using $VCO_1$. The BSAC output signal 52 is usable by the PLLME 40 to provide further indication of the frequency that should be provided to the selected VCO.

The BSAC 38 is configured to determine whether to toggle the current bit of interest and to toggle the next-most-significant bit, relative to the current bit of interest, in response to each clock pulse until each bit of the 4-bit BSAC output signal 52 is determined. As shown in FIG. 4, the BSAC 38 provides new output signal values in response to each clock pulse until the $n^{th}$ clock pulse. At the $n^{th}$ clock pulse, the BSAC 38 toggles the current bit of interest for the final BSAC output signal 52 if the PLL 20 did not lock and provides the same output signal value as previously provided if the PLL 20 did lock. The BSAC 38 is configured to continue to provide the final BSAC output signal 52, as indicated by a bottom row 54 of the chart shown in FIG. 4, until the device 14 is powered down. The BSAC 38 is further configured to received at least one clock signal after the $n^{th}$ clock pulse, an $n+1^{th}$ clock pulse, from the timer 26. The BSAC 38 is configured to, in response to receiving the $n+1^{th}$ clock pulse, provide the disable flag to the timer 26, the clock 36, the VCO select 34, and the calibration select 32.

The PLLME 40 is configured to receive the BSAC output signal 52 and to convert the value of this output signal 52 into an 11-bit signal indicative of the frequency of the signal to be provided to the selected VCO. The PLLME 40 is configured to convert the n-bit, here 4-bit, output signal 52 from the BSAC 38 into the 11-bit PLLME output signal 46 by adding 103 in binary form (that uses 7 bits) to the 4-bit BSAC output signal 52. The number, here 103, added depends on the reference frequency $f_{REF}$ (FIG. 1). This example assumes that the PLL 20 uses the conversion $f_{out}$=N * $f_{REF}$, where $f_{out}$ ranges from at most 1.35 GHz to at least 1.5 GHz, and that $f_{REF}$=13 MHz. In this case, n ranges from 103.846 to 116.307, or, rounding, from 103 to 117. The 4-bit word provides numbers from 0 to 15. Thus, if 103 is added to the 4-bit word, an 11-bit word results that ranges from 103 to 118, which covers the desired 103–117 range.

Referring to FIGS. 3–6, in operation the transceiver 18 determines a frequency cross-over point for the VCOs during calibration and uses this point during normal mode to select which VCO to use to lock to the frequency of an incoming signal. Initially, upon startup or power-up the TAC 22 determines, during a calibration mode (FIG. 5), the cross-over point of the frequency ranges of the VCOs of the PLL 20. Based upon the calibration the TAC 22 determines, during a normal mode (FIG. 6), which VCO to select based upon a frequency of an incoming signal.

The calibration mode process 60 includes the stages shown, although stages can be added, deleted, or rearranged. At stage 62, when the transceiver 18 is powered up, the calibration mode is initiated, e.g., by sending an enable flag to, or producing the enable flag in, the 3-wire circuit 28.

At stage 64 the 3-wire circuit 28 provides the enable flag to the calibrationselect 32, the VCO select 34, and the timer 26. In response to receiving the enable flag, the calibrationselect 32 connects the 3-wire circuit output carrying the output signal 44 to the output of the calibrationselect 32 so that the output signal 44 is transmitted as the calibrationselect output signal 42 to the PLL 20. At stage 66, VCO select 34, in response to receiving the enable flag, transmits the VCO select output signal 48 to the PLL 20 to instruct the PLL 20 to activate a $VCO_1$, for example, $VCO_1$. Also in response to receiving the enable flag, the timer 26 begins operating, periodically sending clock pulses to the comparator 36 and the BSAC 38.

At stage 68, the BSAC 38 sets the initial value of the 4-bit output signal 52. The BSAC 38 sets the initial output signal 52, e.g., in response to receiving an initial clock pulse from the timer 26, in response to the enable flag. The BSAC 38 sets the value of the output signal 52 to have the most-significant bit be a binary 1 and the remaining bits be binary 0's. This output signal 52 is transmitted to the PLLME 40 that converts the 4-bit output signal 52 into an 11-bit PLLME output signal 46 that is transmitted to both the VCO select 34 and the calibrationselect 32. The VCO select 34 preferably does nothing with the PLLME output signal 46 at this stage, but the calibrationselect 32 transmits the PLLME output signal 46 to the PLL 20 as the output signal 42. The PLL 20 uses the received output signal 42 as a value N to provide a signal having a corresponding frequency to $VCO_1$ according to $f_{out}=N * f_{REF}$.

At stage 70, in response to a clock pulse an inquiry is made as to whether this clock pulse is the $n+1^{th}$ clock pulse. If this clock pulse is the $n+1^{th}$ pulse, then the process 60 proceeds to stage 77 where an n-bit word indicated by the BSAC output signal 52 is written to memory in the PLLME 40. The process 60 also proceeds to stage 78 where the BSAC 38 transmits the disable flag to the timer 26, the comparator 36, the VCO select 34, and the calibrationselect 32. If this clock pulse is not the $n+1^{th}$ clock pulse, then the process 60 proceeds to stage 72.

At stage 72, an inquiry is made as to whether the PLL 20 has locked. The inquiry at stage 72 is made upon receipt of a clock pulse from the timer 26. This inquiry is made by the comparator 36 comparing the tuning voltage $V_{tune}$ with the reference voltage REF. If the comparator output signal 50 indicates that the PLL 20 exceeds the upper threshold, then the BSAC 38 toggles the current bit of interest, at stage 74. The BSAC 38 writes a 0 to memory for the current bit. If the comparator output signal 50 indicates that the PLL 20 is within range, then the BSAC 38 writes a 1 to memory as the current bit of interest at stage 75. No matter whether the PLL 20 is determined to have locked or not, at stage 76, the BSAC 38 toggles the next-most-significant bit relative to the current bit of interest, which becomes the current bit of interest. Thus, if the PLL 20 does not lock when the BSAC output signal 52 has a value of 1000 as indicated by state 100 in FIG. 4, then the current bit of interest is toggled to 0 (and written to memory) and the next most-significant bit is toggled to 1 as indicated by state 102 in FIG. 4. If, however, the PLL 20 locks when the BSAC output signal 52 has a value of 1000, then the BSAC 38 writes a 1 to memory for the current bit and toggles only the next most-significant bit to 1 as indicated by state 104 in FIG. 4. The PLL 20 attempts to lock to the newly-indicated frequency and the process 60 returns to state 70 to determine whether the $n+1^{th}$ clock pulse has been received. If, at stage 76, there is no next most-significant bit, then preferably no operation is performed at stage 76 and the process 60 returns to stage 70.

The BSAC 38 does not necessarily toggle bits, toggling is used to indicate that the binary value of a bit is different or changed (i.e., from 1 to 0 or 0 to 1) between binary words. The BSAC 38 outputs the signal 52 with appropriate values as discussed, even if individual bits are not physically toggled (e.g., if a new word is formed versus altering a bit of a parallel-output word).

In response to determining at stage 70 that the $n+1^{th}$ clock pulse has been received, the process 60 proceeds to stage 77 where the n-bit word of the BSAC output signal 52 is stored in memory in the PLLME 40 and to stage 78 where the calibration mode is disabled. Stage 70 can be implemented with a counter such that when the counter reaches n+1, the process 60 proceeds to stage 77. The initial inquiry made by stage 70 occurs in response to the first clock pulse, and the stages 72, 74, and 76 can be processed, and the PLL 20 can lock, within one cycle of the timer 26 such that n potential adjustments are made to the BSAC output signal 52 before storing at stage 77 and disabling at stage 78. At stage 78, the BSAC 38 transmits the disable flag to the timer 26, the comparator 36, the VCO select 34, and the calibrationselect 32. The BSAC 38 retains (e.g., stores) the value of, and continues outputting, the final BSAC output signal 52 until the device 14 is powered down. In at least one embodiment, the comparator 36 is disconnected from the BSAC 38 to help prevent current being drawn by the comparator 36 that occurs if a connection exists between the comparator 36 and the BSAC 38. The VCO select 34 adjusts to determine the VCO select output signal 48 depending on the PLLME output signal 46 and the 3-wire circuit output signal 44. The calibrationselect 32 adjusts to ignore the PLLME output signal 46 and to forward the 3-wire circuit output signal 44 to the PLL 20. Also at stage 78, when the disable flag is transmitted by the BSAC 38, the transceiver 18 enters normal mode.

Referring to FIGS. 1–3 and 6, a process 80 of normal mode operation of the transceiver 18 includes the stages shown, although stages can be added, deleted, or rearranged. At stage 82, a digital indication of the frequency to lock to is transmitted to the 3-wire circuit 28 on the data line of the 3-wire bus 30. In at least one embodiment, the 3-wire circuit 28 converts the signal data to a parallel format from a serial format and transmits the resulting 11-bit output signal 44 to the VCO select 34 and the calibrationselect 32. The calibrationselect 32 forwards the signal 44 to the PLL 20 as the calibrationselect output signal 42.

At stage 84, the VCO select 34 receives the 3-wire circuit output signal 44 and the PLLME output signal 46 corresponding to the final BSAC output signal 52. The VCO select 34 digitally compares the output signals 44 and 46 to determine the relative frequencies indicated by the two signals 44 and 46. The VCO select 34 determines whether the frequency indicated by the PLLME output signal 46 is greater than, or less than or equal to, the frequency indicated by the 3-wire circuit output signal 44.

Figure 5:
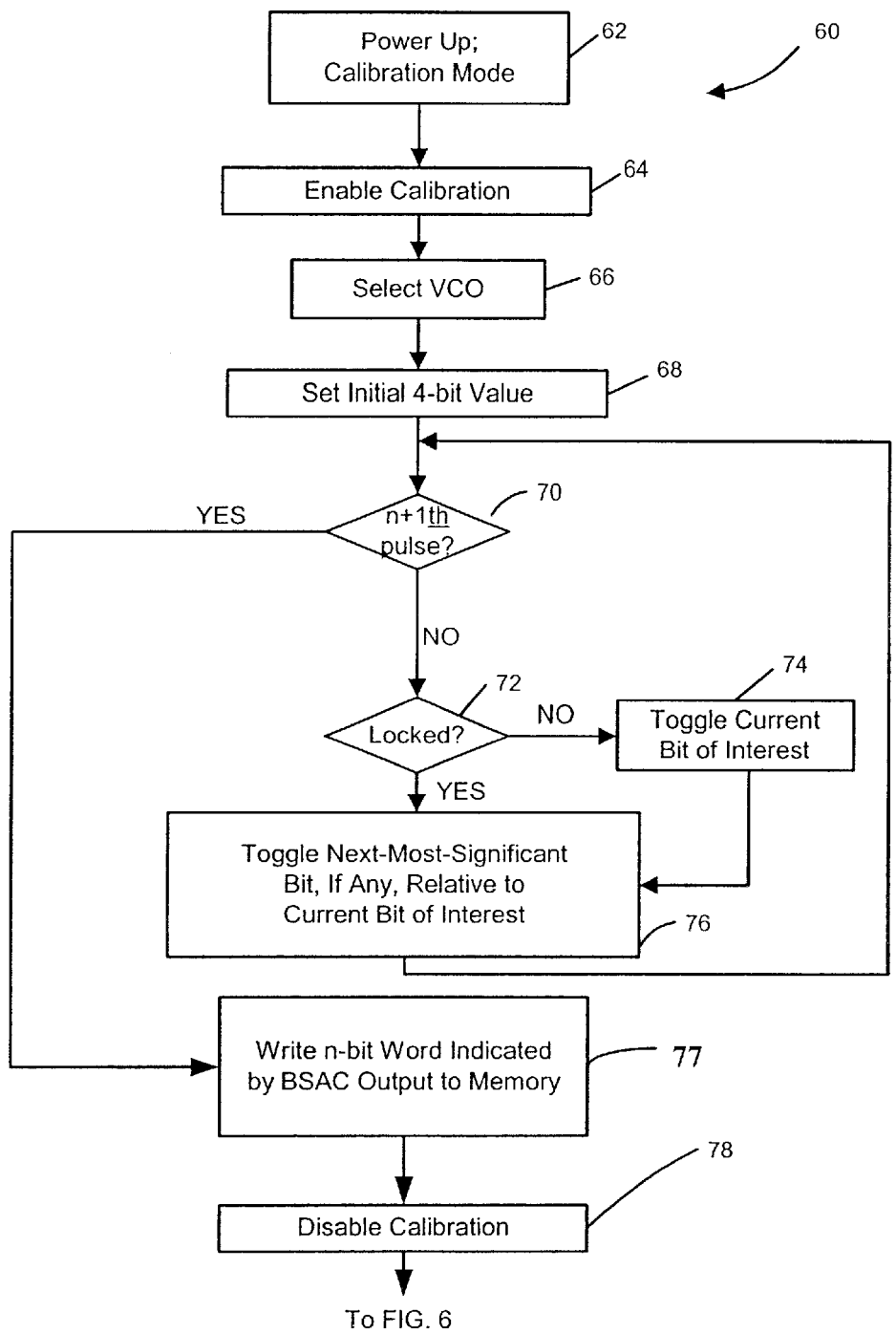
FIG. 5 is a block flow diagram of a calibration mode process of the receiver shown in FIG. 3.
Figure 6:
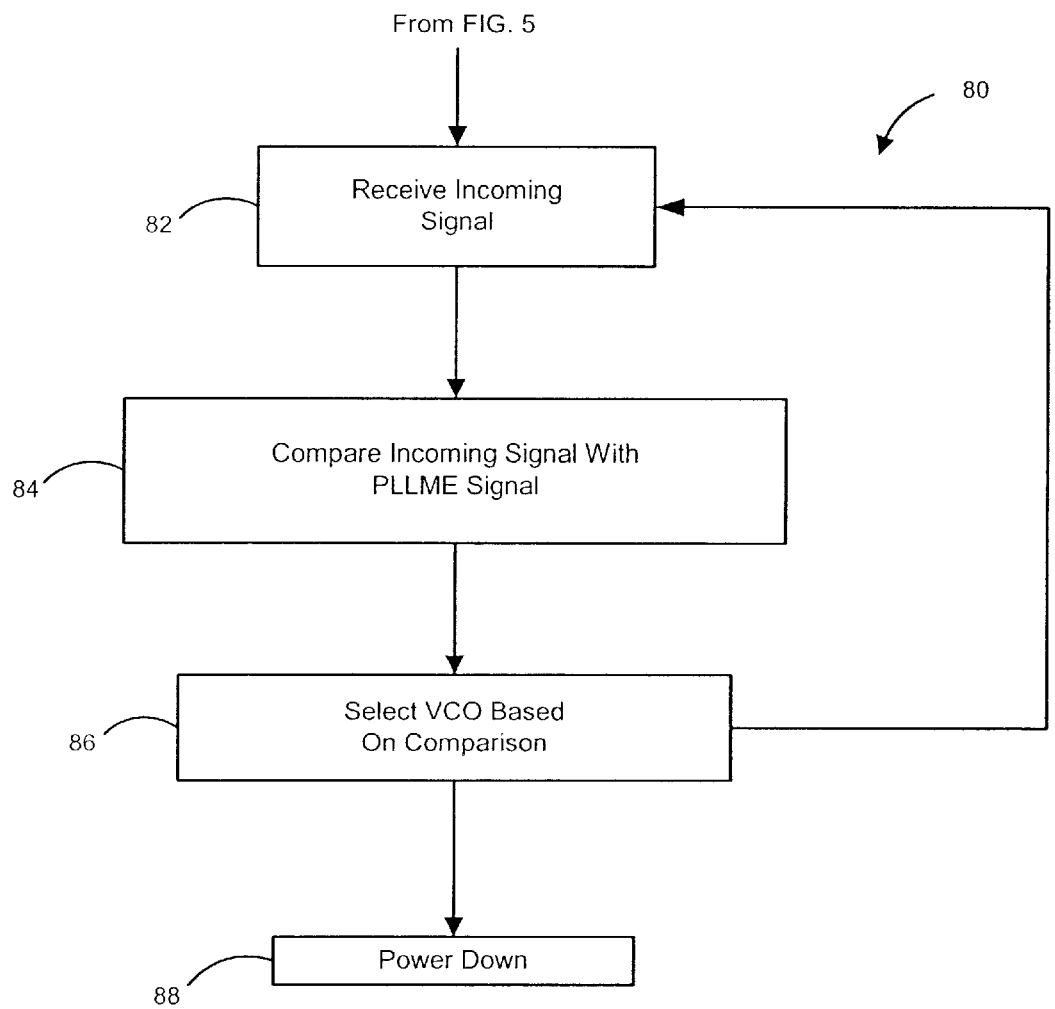
FIG. 6 is a block flow diagram of a normal operation mode process of the receiver shown in FIG. 3.

At stage 86, the VCO select 34 outputs the VCO select output signal 48 in response to the determination of the relative frequencies indicated by the signals 44 and 46 to instruct the PLL 20 which VCO to use to tune to the frequency of the incoming signal on the bus 30. The frequency indicated by the PLLME output signal 46 represents the highest frequency, within the resolution of the BSAC 38 (i.e., the resolution of frequencies that can be indicated by the n-bit signal 52), for which $VCO_1$ can be used by the PLL 20 and have the PLL 20 lock. If the frequency indicated by the PLLME output signal 46 is greater than or equal to the frequency of the incoming signal as indicated by the output signal 44, then the VCO select 34 outputs the signal 48 to instruct the PLL 20 to use $VCO_1$. If the frequency indicated by the signal 46 is less than the frequency indicated by the signal 44, then the VCO select 34 outputs the signal 48 to instruct the PLL 20 to use $VCO_2$. The selection by the VCO select 34 is used until the incoming signal is no longer received. If a new incoming signal is received, the process returns to stage 82. If the device 14 is powered down, then the process proceeds to stage 88, and upon power up the process 60 shown in FIG. 5 is executed.

While various embodiments of the application have been described, it will be apparent to those of ordinary skill in the art that many more embodiments and implementations are possible that are within the scope of this invention. Accordingly, the invention is not to be restricted except in light of the attached claims and their equivalents. For example, the n-bit signal 52 from the BSAC 38 may be more, or less, than four (4) bits. Also, the PLL 20 may have more than two VCOs. If so, then the BSAC output signal 52 could be scaled to accommodate higher frequency ranges to determine frequency cross-over points between the VCOs. The BSAC 38 could store multiple cross-over point frequencies and the normal mode could use several inquiries/comparisons by the VCO select 34 to determine which VCO to use. Alternatively, if the relationships between cross-over points are known, then one cross-over point can be determined as described above. The determined cross-over point, the relationship among cross-over points, and the frequency of the incoming signal could be used to determine which VCO to use.

Also, other numbers of bits for the BSAC 38, and corresponding BSAC output signal 52, and output signals 44 and 46 could be used. Other numbers could be used to add to the output signal 46 (FIG. 3), e.g., to provide different frequency ranges or if a different reference frequency $f_{REF}$ if used.

Therefore, from the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed:

1. A tuning circuit, for use with a phase-locked loop (PLL) that includes multiple voltage-controlled oscillators (VCOs), the circuit comprising:
   a VCO selector configured to provide an indication of which of the multiple VCOs the PLL should use; and
   a search circuit coupled to the VCO selector, the search circuit being configured to provide a first test signal, associated with a first PLL output frequency, to the PLL, to receive a PLL response to the first test signal, and to provide a second test signal, associated with a second PLL output frequency, to the PLL in response to the PLL response, the first and second PLL output frequencies being different.

2. The tuning circuit of claim 1 wherein the search circuit is configured to determine an extreme frequency, within a range and a resolution of the search circuit, producible by the selected VCO within a desired tuning range of the selected VCO.

3. The tuning circuit of claim 2 wherein the extreme frequency is a maximum useful frequency.

4. The tuning circuit of claim 2 wherein the second test signal is related to the first test signal according to a binary search algorithm.

5. The tuning circuit of claim 4 wherein the binary search algorithm is configured to determine the extreme frequency in a quickest manner possible using a binary search algorithm.

6. The tuning circuit of claim 4 wherein the first and second test signals have corresponding first and second binary representations that differ by at least one bit and at most 2 bits.

7. The tuning circuit of claim 6 wherein the second binary representation is related to the first binary representation in that a selected-significance bit is toggled relative to the first binary representation and, depending on the PLL response, a bit adjacent to the selected-significance bit is also toggled relative to the first binary representation.

8. The tuning circuit of claim 7 wherein the adjacent bit is a next-most-significant bit relative to the selected-significance bit.

9. The tuning circuit of claim 8 wherein the adjacent bit is toggled in the second binary representation relative to the first binary representation if the first frequency is too high for the PLL to lock to with the selected VCO operating within the desired tuning range of the selected VCO, and the adjacent bit is the same in the first and second binary representations if the PLL response indicates that the PLL locked.

10. The tuning circuit of claim 2 wherein the search circuit is configured to provide an extreme-frequency indication corresponding to the determined extreme frequency, and wherein the VCO selector is configured to provide the indication of which VCO to use based on the extreme-frequency indication and a desired-frequency indication related to a desired frequency for the PLL to synthesize.

11. The tuning circuit of claim 10 wherein the search circuit is configured to store the extreme-frequency indication and the search circuit is configured to compare the extreme-frequency indication and the desired-frequency indication.

12. A transceiver for use with a device that includes an antenna configured to receive incoming radio-frequency signals, the transceiver comprising:
    a phase-locked loop (PLL) including a plurality of selectable voltage-controlled oscillators (VCOs) together providing a continuous tuning band of frequencies; and
    a tuning circuit coupled to receive data indicative of the signals received by the antenna and coupled to the PLL and including a VCO-select unit configured to provide a VCO-select signal to control selection of the VCOs by the PLL.

13. The transceiver of claim 12 wherein the VCO-select unit is configured to provide the VCO-select signal in response to a first indication of a frequency desired to be synthesized by the PLL and at least one second indication of a frequency producible by at least one of the VCOs given a tuning voltage within a desired tuning voltage range, the at least one second indication being indicative of a cross-over frequency related to an extreme frequency producible by a selected VCO using a tuning voltage within the desired voltage range.

14. The transceiver of claim 12 wherein the tuning circuit further includes a search unit coupled to the VCO-select unit, the search unit being configured to determine and provide a search-unit output related to the at least one second indication, the search unit is configured to implement an n-bit word binary search algorithm in which the search unit provides, to the PLL, a test signal related to an n-bit word used in the algorithm and indicative of a test frequency.

15. The transceiver of claim 14 wherein the search unit is configured to use, in the algorithm, a first n-bit word with a most-significant bit (MSB) of the first n-bit word being a 1 and with each other bit of the first n-bit word being 0.

16. The transceiver of claim 15 wherein the search unit is configured to use a second n-bit word in the algorithm, the second word being the first word with a current bit of interest of the first word and a next-most-significant bit relative to the current bit of interest of the first word being set to 1 and each other less-significant bit of the first n-bit word being set to 0 if the PLL locks to a test frequency associated with the first n-bit word, and the next-most-significant bit relative to the current bit of interest of the first word being set to 1 and each other less-significant bit and the current bit of interest of the first n-bit word being set to 0 if the PLL fails to lock to the test frequency associated with the first n-bit word.

17. The transceiver of claim 12 wherein the tuning circuit and the PLL are portions of an integrated circuit sharing a common semiconducting substrate.

18. A method comprising:
providing, on a common semiconducting substrate, a phase-locked loop (PLL) that includes multiple voltage-controlled oscillators (VCOs) and a control circuit coupled to the PLL;
selecting at least a first of the VCOs;
transmitting a plurality of test signals to the PLL from the control circuit, the test signals being associated with different frequencies;
receiving, in the control circuit, indicia of whether the PLL locked to the frequencies associated with the test signals using the selected VCO;
determining, based on the indicia of whether the PLL locked, which one of the VCOs to use to have the PLL synthesize a desired frequency.

19. The method of claim 18 wherein the determining determines a reference for use in selecting which one of the VCOs to use, the reference being a cross-over point indicative of a first end of a first frequency range for which a first of the VCOs should be selected for having the PLL synthesize the desired frequency.

20. The method of claim 19 wherein the cross-over point is associated with at least one of the test signals.

21. The method of claim 19 wherein the cross-over point is indicative of an extreme frequency within a resolution of possible frequencies associated with a set of possible test signals.

22. The method of claim 21 wherein the extreme frequency is a maximum usable frequency.

23. The method of claim 22 wherein the test signals are transmitted serially.

24. The method of claim 23 wherein an initial test signal is associated with a frequency that is approximately half way between a minimum frequency and a maximum frequency associated with the set of possible test signals.

25. The method of claim 24 wherein each successive test signal is associated with a frequency that is approximately half way between a minimum frequency and a maximum frequency of a subset of the possible test signals, the subset depending upon a test signal immediately prior to the successive test signal and whether the PLL locked to a frequency associated with the immediately prior test signal.

26. The method of claim 18 wherein a second frequency associated with a second test signal, following a first test signal associated with a first frequency, is greater than the first frequency if a first indication indicates that the PLL locked to the first frequency and the second frequency is less than the first frequency if the first indication indicates that the PLL failed to lock to the first frequency.

27. The method of claim 26 wherein the test signals correspond to a binary search algorithm of test signals and associated frequencies.

28. The method of claim 27 wherein the binary search algorithm is configured such that the determing determines which VCO to use in a quickest manner possible using a binary search algorithm.

29. The method of claim 27 wherein a last test signal in the algorithm is associated with the cross-over point, the final test signal being associated with a final frequency that is different than a second-to-last frequency associated with a second-to-last test signal depending on whether the PLL locks to the second-to-last frequency.

30. The method of claim 29 wherein the final frequency is the same as the second-to-last frequency if the PLL locks to the second-to-last frequency and the final frequency is less than the second-to-last frequency if the PLL fails to lock to the second-to-last frequency.

31. The method of claim 18 further comprising determining another cross-over point, the another cross-over point being indicative of a second end of a second frequency range for which a second of the VCOs should be selected for having the PLL synthesize the desired frequency.

32. An apparatus for wirelessly transmitting and receiving signals, the apparatus comprising:
an antenna configured to receive and transmit radio-frequency signals; and
a transceiver coupled to the antenna, the transceiver including:
a phase-locked loop (PLL) disposed on a semiconducting substrate and including at least two voltage-controlled oscillators (VCOs) each having a corresponding frequency tuning range, the frequency tuning ranges at least partially overlapping; and
a control circuit disposed on the semiconducting substrate and coupled to the PLL, the control circuit including logic configured to determine at least one parameter for use in selecting which VCO of the PLL to use, the control circuit being configured to select a VCO based on the parameter and a frequency to be synthesized by the PLL.

33. The apparatus of claim 32 wherein the control circuit is configured to provide a plurality of test signals, associated with a corresponding plurality of different frequencies, to the PLL and to determine the parameter based on whether the PLL locks to the frequencies.

34. The apparatus of claim 33 wherein the control circuit is configured to provide a first test signal having an associated first frequency approximately in the middle of a first range of frequencies, a first subset of frequencies being above the first frequency and a second subset of frequencies being below the first frequency, the control circuit further configured to provide a second test signal having an associated second frequency approximately in the middle of one of the first and second subsets of frequencies.

35. The apparatus of claim 34 wherein the PLL is configured to attempt to lock to frequencies associated with test signals provided to the PLL, and where which subset of frequencies contains the second frequency depends on whether the PLL locks to the first frequency.

36. The apparatus of claim 32 wherein the control circuit is configured to determine the at least one parameter free of stimulus or control from a source external to the semiconducting substrate.

37. A transceiver integrated circuit for use with a device that includes an antenna configured to transmit and receive radio-frequency signals, the transceiver integrated circuit comprising:
a phase-locked loop (PLL) disposed on a semiconducting substrate and including a pair of selectable voltage-controlled oscillators (VCOs) having overlapping frequency ranges corresponding to a common tuning-voltage range; and
means, disposed on the semiconducting substrate and coupled to the PLL, for determining which VCO to select and for selecting a VCO based upon at least one oscillation frequency of at least one of the VCOs and a frequency desired to be synthesized by the PLL.

38. The transceiver of claim 37 wherein the determining and selecting means is configured to provide a plurality of test signals to the PLL associated with different frequencies and to receive indicia from the PLL as to whether the PLL locked to the associated frequencies.

39. The transceiver of claim 37 wherein the determining and selecting means is configured to determine a parameter for use in selecting a VCO in response to the transceiver being powered up, and to retain the parameter until the transceiver is powered down.

40. The transceiver of claim 39 wherein the parameter is indicative of a frequency cross-over point associated with an extreme frequency for the PLL to lock to using a selected one of the VCOs.

41. The transceiver of claim 40 wherein the extreme frequency is a maximum useful frequency.

42. The transceiver of claim 40 wherein the frequency cross-over point is within a range of overlapping frequencies associated with the VCOs.

43. The transceiver of claim 37 wherein the determining and selecting means is configured to determine and select a VCO free of stimulus or control from a source external to the semiconducting substrate.

44. A method, in a device configured to transmit and receive radio-frequency (RF) signals, comprising:

providing, on a common semiconducting substrate, a phase-locked loop (PLL) that includes multiple voltage-controlled oscillators (VCOs) and a control circuit coupled to the PLL, the VCOs having frequency ranges, corresponding to a common tuning-voltage range, that at least partially overlap;

selecting a first of the VCOs in response to powering up of the device;

determining an indication of an extreme usable output frequency for use of the first VCO;

retaining the indication of the extreme frequency;

receiving a signal including an indication of a PLL output frequency to be synthesized;

using the indication of the extreme frequency and the indication of the PLL output frequency to be synthesized to actuate a VCO from the multiple VCOs to use; and providing the received signal to the PLL.

45. The method of claim 44 wherein the indication of the extreme frequency is compared to the indication of the PLL output frequency to actuate the VCO.

46. The method of claim 45 wherein if the extreme frequency is greater than the PLL output frequency, then the first VCO is actuated.

* * * * *